(12) United States Patent
Hessburg et al.

(10) Patent No.: US 6,264,404 B1
(45) Date of Patent: Jul. 24, 2001

(54) SYSTEM AND METHOD FOR HYDRODYNAMIC LOADING AND UNLOADING OF OBJECTS INTO AND OUT OF SUBSTANTIALLY TOUCHLESS HYDRODYNAMIC TRANSPORT SYSTEMS

(75) Inventors: Merilly Ann Hessburg, Fremont; Timothy John Lindsley, San Jose; David Craig Darrow; John Edgar Sheffield, both of Pleasanton, all of CA (US)

(73) Assignee: Seagate Technology, Inc., Scotts Valley, CA (US)

( * ) Notice: Subject to any disclaimer, the term of this patent is extended or adjusted under 35 U.S.C. 154(b) by 0 days.

(21) Appl. No.: 09/348,357

(22) Filed: Jul. 7, 1999

Related U.S. Application Data

(60) Provisional application No. 60/092,827, filed on Jul. 13, 1998.

(51) Int. Cl.[7] .................................................. B65G 53/40
(52) U.S. Cl. ........................ 406/108; 406/122; 414/676; 414/139; 414/156; 414/50; 15/88.3
(58) Field of Search ..................................... 406/122, 146, 406/139, 142, 50, 88; 414/676; 15/88.3

(56) References Cited

U.S. PATENT DOCUMENTS

| | | | |
|---|---|---|---|
| 3,734,567 | * | 5/1973 | Fong ........................................ 406/86 |
| 4,236,851 | * | 12/1980 | Szasz ....................................... 406/72 |
| 4,293,249 | * | 10/1981 | Whelan .................................... 406/72 |
| 4,402,613 | * | 9/1983 | Daly et al. .............................. 406/72 |
| 4,795,299 | * | 1/1989 | Boys et al. . |
| 5,209,387 | * | 5/1993 | Long et al. ............................. 226/97 |
| 5,213,451 | * | 5/1993 | Frank et al. ............................ 406/72 |
| 5,442,828 | * | 8/1995 | Lutz ....................................... 15/88.3 |
| 5,762,084 | * | 6/1998 | Krusell et al. ........................ 134/184 |
| 5,884,392 | * | 3/1999 | Lafond .................................... 29/722 |
| 5,950,327 | * | 9/1999 | Peterson et al. ........................ 34/328 |
| 5,950,643 | * | 9/1999 | Miyazaki et al. .................... 134/25.4 |
| 5,964,952 | * | 10/1999 | Kunze-Concewitz . |
| 5,975,736 | * | 11/1999 | Simmons et al. ..................... 364/132 |
| 6,045,299 | * | 4/2000 | van Kessel et al. ................... 406/86 |

* cited by examiner

*Primary Examiner*—Robert P. Olszewski
*Assistant Examiner*—Richard Ridley
(74) *Attorney, Agent, or Firm*—Merchant & Gould P.C.

(57) ABSTRACT

A system for hydrodynamically loading objects into a manufacturing system is disclosed. The system comprises a receptacle for retaining fluid, the receptacle having an aperture for egress to a manufacturing system. At least one cassette is supported within the receptacle for retaining a plurality of objects and positioning one of the objects in a loading location in alignment with the aperture. At least one nozzle is also disposed within the receptacle for ejecting fluid and urging objects in the loading location into the aperture.

10 Claims, 9 Drawing Sheets

SYSTEM AND METHOD FOR HYDRODYNAMIC LOADING AND UNLOADING OF OBJECTS INTO AND OUT OF SUBSTANTIALLY TOUCHLESS HYDRODYNAMIC TRANSPORT SYSTEMS

This application claims priority under 35 U.S.C. §119(e) from United States Provisional Patent Application No. 60/092,827, filed Jul. 13, 1998.

BACKGROUND OF THE INVENTION

1. Field of the Invention

Embodiments of this invention relate generally to the transport of objects between various manufacturing process steps, and in particular embodiments to methods for hydrodynamically loading and unloading objects into and out of substantially touchless hydrodynamic transport systems, and systems incorporating the same.

2. Description of Related Art

Modem manufacturing methods often require a number of processing steps to be performed on an object to transform or prepare the object into a finished product. Even after the object has been fabricated, cleaning steps may be required to remove residue and contaminants such as particulates, organics, and inorganics collected during processing. For example, in conventional magnetic recording media processing techniques a slurry is applied to texture the surface of the magnetic media. This slurry must subsequently be removed, often by mechanically scrubbing the magnetic recording media using polyvinyl alcohol (PVA) rollers. Several cleaning steps may be required, because magnetic recording media often requires particle removal efficiencies as small as 0.3 microns, and inorganic/organic particulate levels as low as $1 \times 10^{10}$ atoms/cm$^2$.

Careful handling is essential as these fragile objects are transported between process steps. Conventional techniques employed for transporting delicate objects such as semiconductor wafers and magnetic recording media between process stations may require both mechanical and human intervention. Once the object completes a processing step, it is loaded into a transportation cassette, carried by process operators to the next processing station, and unloaded from the cassette. This intervention increases the chance of damage to, and contamination of, the objects.

Human intervention and manual transportation between processing steps in a multi-step cleaning system can be eliminated by employing substantially touchless hydrodynamic transport chutes to transport objects from one process module to another. One example of substantially touchless hydrodynamic transport chutes is disclosed in U.S. patent application Ser. No. 09/196,856. Each substantially touchless hydrodynamic transport chute includes a transfer slot formed between two walls. Formed in the walls and directed into the transfer slot are support nozzles angled towards the output side of the transfer slot for creating fluid flow and fluid bearings in the transfer slot and urging objects through the transfer slot. In addition, induction nozzles are formed in the walls near the input side of the transfer slot for inducing objects into the input side of the transfer slot. A base supports the first and second walls and is grooved in substantial alignment with the transfer slot for receiving and bottom-centering objects in the transfer slot.

However, even if an processing system with hydrodynamic transport chutes between process modules is employed, manual loading and unloading of objects into and out of such systems is still required. In addition, because hydrodynamic transport chutes may transport only one object at a time, the manual and repetitive loading and unloading of single objects into and out of such automated processing systems increases the chance of frictional wear and damage to the object as it comes into contact with the cassettes and human hands, and increases the chance of breakage of the object due to dropping or other mishandling. Contaminants may also be introduced during the loading and unloading process. Manual loading and unloading techniques also may be slower due to the lack of automation and required human intervention, and may be costlier due to the employment of process operators. In addition, no process steps may be carried out during the loading and unloading process.

SUMMARY OF THE DISCLOSURE

Therefore, it is an object of embodiments of the invention to provide a system and method for hydrodynamic loading and unloading of objects into and out of substantially touchless hydrodynamic transport systems to minimize frictional wear and damage to the object. Touchless, as defined herein, is the absence of contact with solid surfaces.

It is a further object of embodiments of the invention to provide a system and method for hydrodynamic loading and unloading of objects into and out of substantially touchless hydrodynamic transport systems to minimize the chance of breakage of the object due to dropping or other mishandling.

It is a further object of embodiments of the invention to provide a system and method for hydrodynamic loading and unloading of objects into and out of substantially touchless hydrodynamic transport systems to minimize the introduction of contaminants.

It is a further object of embodiments of the invention to provide a system and method for hydrodynamic loading and unloading of objects into and out of substantially touchless hydrodynamic transport systems wherein multiple objects can be serially loaded or unloaded into and out of substantially touchless hydrodynamic transport systems in an automated fashion.

It is a further object of embodiments of the invention to provide a system and method for hydrodynamic loading and unloading of objects into and out of substantially touchless hydrodynamic transport systems to increase the speed and efficiency of the manufacturing process while decreasing its costs by automating the transport process.

It is a further object of embodiments of the invention to provide a system and method for hydrodynamic loading and unloading of objects into and out of substantially touchless hydrodynamic transport systems to increase the speed, safety, and efficiency of the manufacturing process by allowing one or more cassettes containing multiple objects to be delivered to the hydrodynamic loading and unloading system.

It is a further object of embodiments of the invention to provide a system and method for hydrodynamic loading and unloading of objects into and out of substantially touchless hydrodynamic transport systems that allows process steps to be performed during the loading and unloading process.

These and other objects are accomplished according to a system for hydrodynamically loading objects into a manufacturing system. The system comprises a receptacle for retaining fluid including, but not limited to, water, air, cleaning solutions, and solvents. The receptacle has an aperture for egress to a manufacturing system. At least one cassette is supported within the receptacle for retaining a plurality of objects and positioning one of the objects in a loading location in alignment with the aperture. At least one nozzle is also disposed within the receptacle for ejecting fluid and urging objects in the loading location into the aperture.

These and other objects, features, and advantages of embodiments of the invention will be apparent to those skilled in the art from the following detailed description of embodiments of the invention, when read with the drawings and appended claims.

DETAILED DESCRIPTION OF PREFERRED EMBODIMENTS

In the following description of preferred embodiments, reference is made to the accompanying drawings which form a part hereof, and in which is shown by way of illustration specific embodiments in which the invention may be practiced. It is to be understood that other embodiments may be utilized and structural changes may be made without departing from the scope of the preferred embodiments of the present invention.

Modem manufacturing methods for producing objects of a particular composition often require a number of processing steps before a finished product is created. Even after the object has been fabricated, multiple cleaning steps may be required to remove residue and contaminants collected during processing. For example, complex multilayered objects such as semiconductor wafers or magnetic recording media may require the removal of certain chemical compositions applied during fabrication by repeatedly scrubbing the surface of the object in different cleaning steps. Careful handling is essential as these fragile objects are transported between cleaning steps.

Human intervention and manual transportation between processing steps can be eliminated by employing substantially touchless hydrodynamic transport chutes to transport objects from one process module to another. One example of substantially touchless hydrodynamic transport chutes is disclosed in U.S. patent application Ser. No. 09/196,856. In addition to the use of substantially touchless hydrodynamic transport chutes between process steps, it is also desirable to provide for the substantially touchless hydrodynamic loading and unloading of objects into and out of such processing systems.

Figure 1:
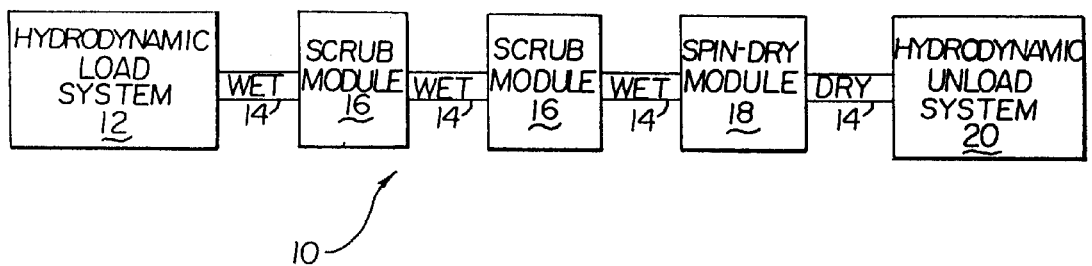
FIG. 1 is a block diagram of a processing system including the substantially touchless loading, unloading, and hydrodynamic transport of objects between manufacturing process steps according to an embodiment of the invention.
Figure 2:
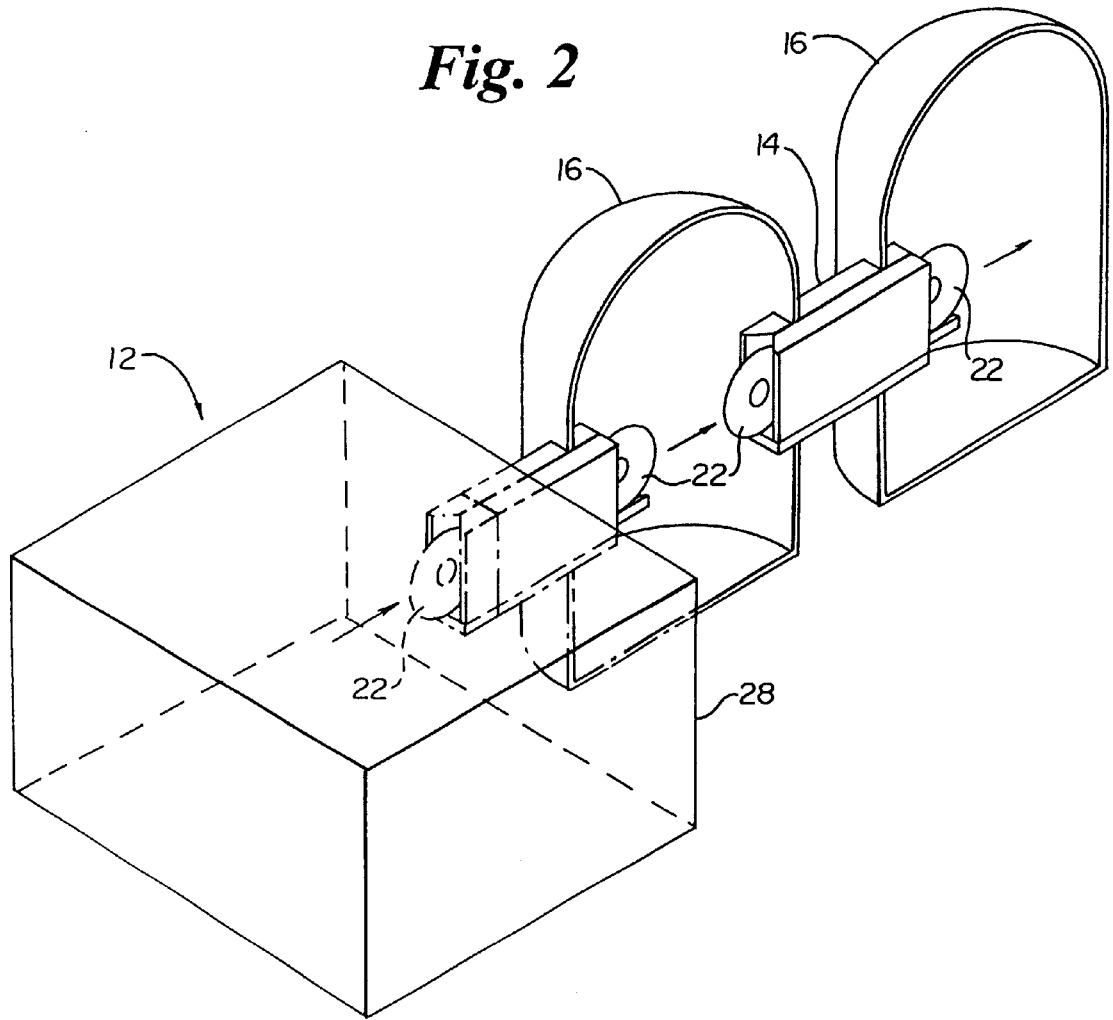
FIG. 2 is a perspective view, partially cut away, of a hydrodynamic loading system coupled to a substantially touchless hydrodynamic transport chute and a multi-process system according to an embodiment of the invention.

FIG. 1 is a block diagram of a manufacturing system 10 including the substantially touchless hydrodynamic loading and unloading objects into and out of manufacturing system 10 according to an embodiment of the present invention. Manufacturing system 10 includes a hydrodynamic load system 12, wet and dry substantially touchless hydrodynamic transport chutes 14, scrub modules 16, a spin-dry module 18, and a hydrodynamic unload system 20. Wet substantially touchless hydrodynamic transport chutes 14 are coupled between hydrodynamic load system 12 and scrub module 16, between scrub modules 16, and between scrub module 16 and spin-dry module 18, and transport objects therebetween. Dry substantially touchless hydrodynamic transport chute 14 is coupled between spin-dry module 18 and hydrodynamic unload system 20, and transports objects therebetween. It should be noted that FIG. 1 is merely representative, and that manufacturing system 10 may include any number of modules coupled together by substantially touchless hydrodynamic transport chutes 14. An illustration of the substantially touchless transport of objects through manufacturing system 10 is illustrated in FIG. 2, wherein objects such as disks 22 are shown leaving hydrodynamic load system 12 and entering and leaving scrub modules 16 through substantially touchless hydrodynamic transport chutes 14.

Referring again to FIG. 1, in embodiments of the invention, unfinished (or unprepared) disks 22 are loaded into hydrodynamic load system 12 for entry into manufacturing system 10. Hydrodynamic load system 12 then delivers disks 22 into a first wet substantially touchless hydrodynamic transport chute 14, where it is transported into a first scrub module 16. Within first scrub module 16, disk 22 may be mechanically scrubbed to remove contaminants. Hardware within first scrub module 16 then aligns disk 22 for insertion into the next wet substantially touchless hydrodynamic transport chute 14, where it is transported into the next scrub module 16. The scrubbing and transport steps are repeated until disk 22 enters a spin-dry module 18, where disk 22 is spun-dry. Hardware within spin-dry module 18 then aligns disk 22 for insertion into a dry substantially touchless hydrodynamic transport chute 14, where it is transported using air or gas as a fluid into a hydrodynamic unload system 20.

Figure 3:
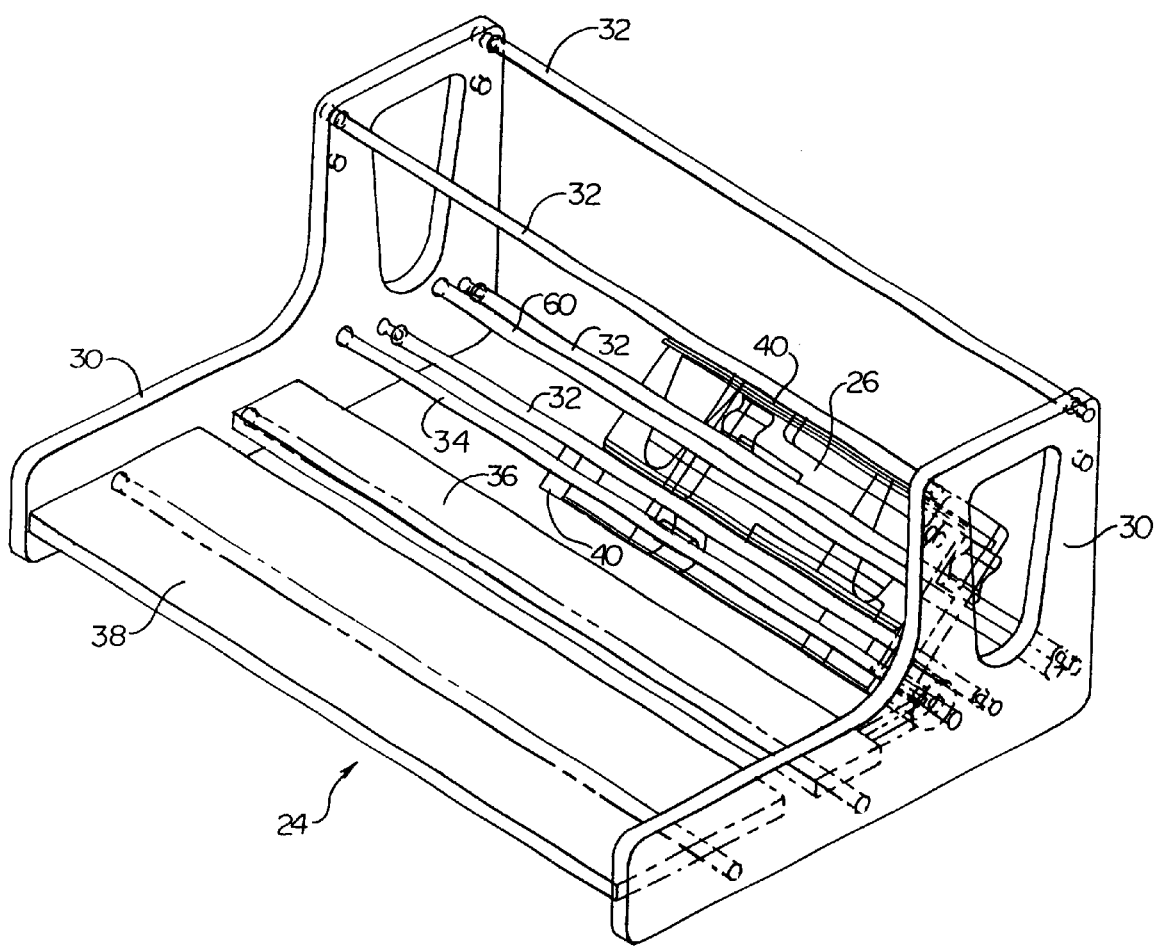
FIG. 3 is a perspective view of a removable indexing rack containing a cassette and cassette holder according to an embodiment of the invention.

FIG. 3 is a perspective view of a removable indexing rack 24 containing a cassette 26 disposed on a cassette holder 40 according to a preferred embodiment of the present invention. Removable indexing rack 24 includes side panels 30, and is sized to be supported within a load tank 28 (see FIG. 2). Rotating cassette support shaft 34 is rotatably disposed within holes in side panels 30. Coupled between side panels 30 are fixed cassette support shaft 60, support rods 32, cassette load shelf 36, and cassette queuing shelf 38. In preferred embodiments of the present invention, multiple removable indexing racks 24 may be employed, wherein each removable indexing rack 24 and corresponding cassette holder 40 and cassette 26 may be differently dimensioned to accommodate disks 22 of different sizes. Indexing rack 24 is removable from load tank 28 to enable hydrodynamic load system 12 to process different sized disks 22, and to facilitate cleaning and maintenance of both the indexing rack 24 and load tank 28.

Figure 4:
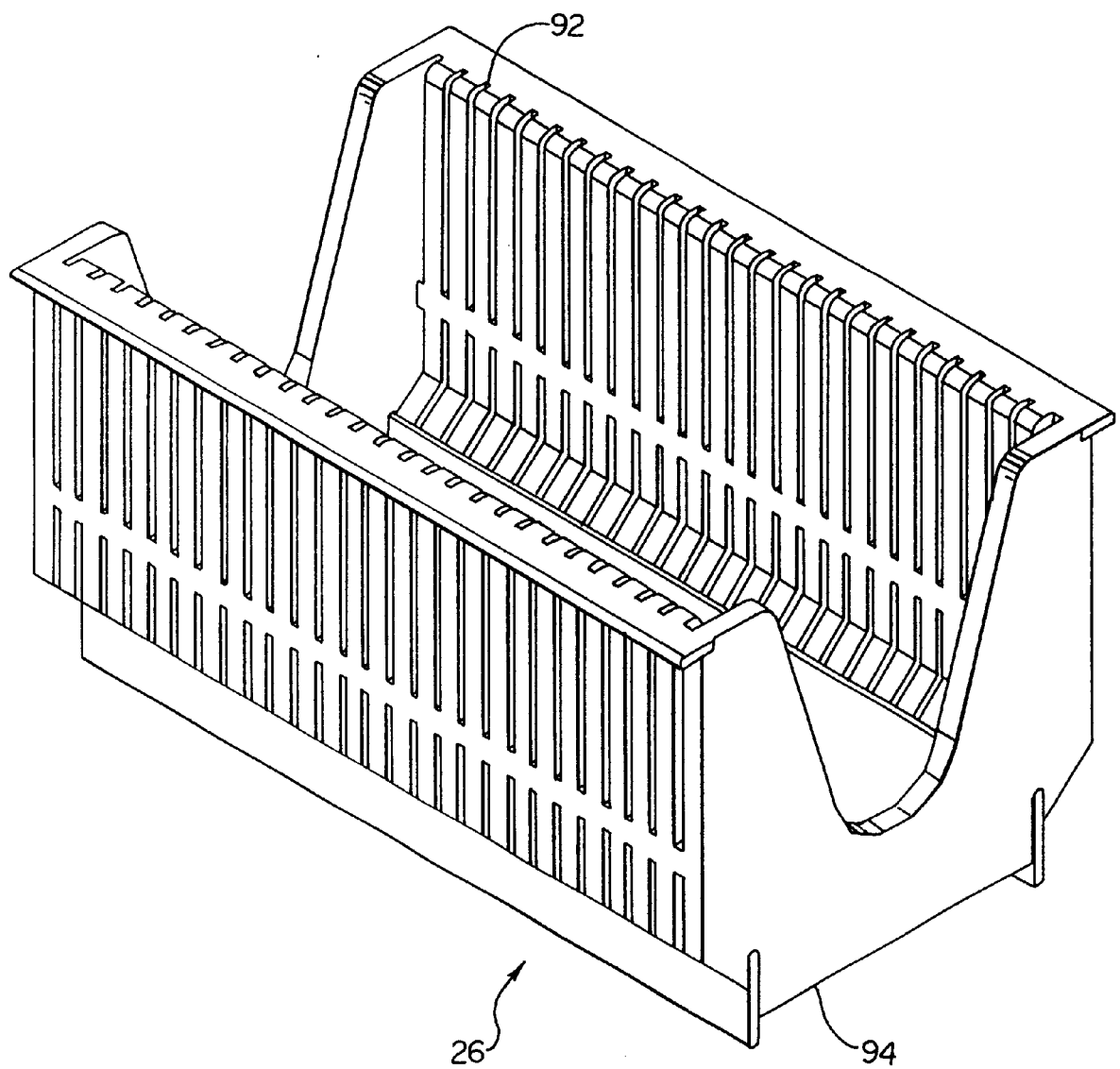
FIG. 4 is a perspective view of a cassette for holding objects according to an embodiment of the invention.

FIG. 4 is a perspective view of cassette 26 including disk slots 92. In preferred embodiments of the present invention, cassette 26 may hold twenty-five (25) disks 22 in disk slots 92. However, in alternative embodiments cassette 26 may be dimensioned to hold any number of disks 22. Cassette 26 has an open cassette bottom 94 to facilitate the pushing of disks 22 out of cassette 26.

Figure 5:
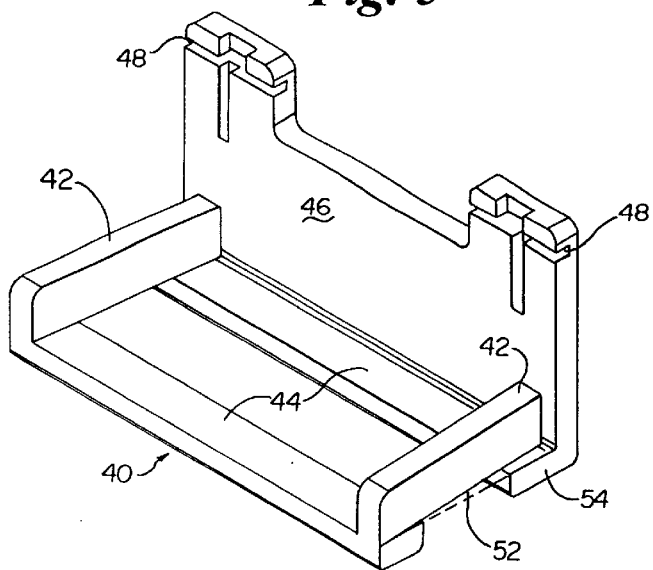
FIG. 5 is a perspective view of a cassette holder for holding a cassette according to an embodiment of the invention.
Figure 6:
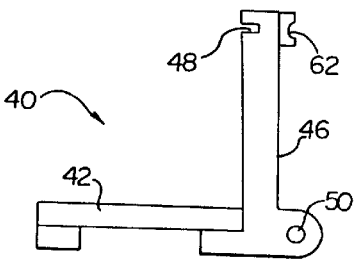
FIG. 6 is a side view of a cassette holder for holding a cassette according to an embodiment of the invention.

FIG. 5 is a perspective view of cassette holder 40 according to a preferred embodiment of the present invention. Cassette holder 40 includes alignment ribs 42, upright support walls 44, horizontal support walls 46, and cassette holder notches 48. In preferred embodiments, alignment ribs 42 are angled (see reference character 52) with respect to cassette holder end walls 54. As illustrated in the side view of FIG. 6, cassette holder 40 further includes shaft openings 50 for rotatably receiving rotating cassette support shaft 34, and bumpers 62.

Figure 7:
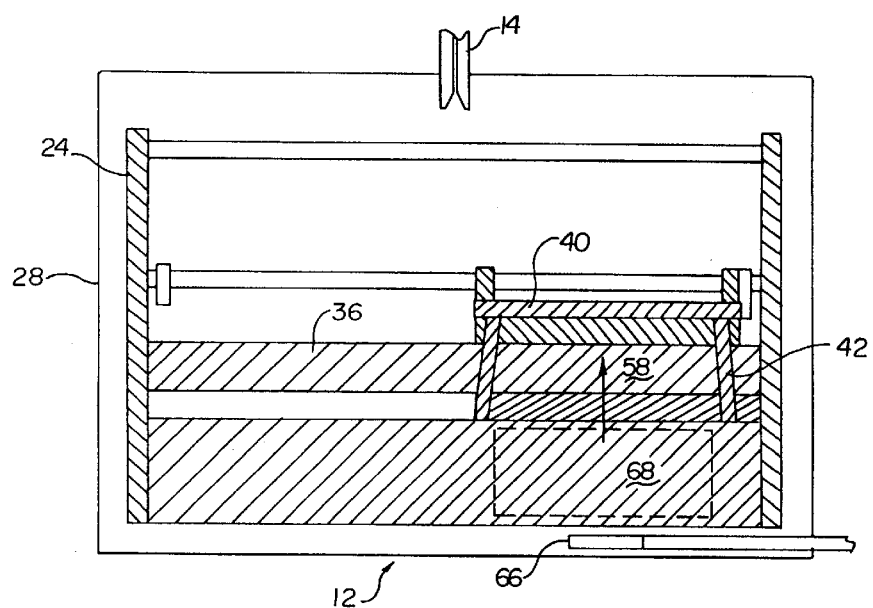
FIG. 7 is a top view of a substantially touchless hydrodynamic transport chute and a hydrodynamic load system including a removable indexing rack and a cassette holder according to an embodiment of the invention.

FIG. 7 is a top view of a substantially touchless hydrodynamic transport chute 14 and a hydrodynamic load system 12 including a removable indexing rack 24 and cassette holder 40. Prior to the automated loading sequence, an operator loads a cassette into load area 68. In alternative embodiments, the loading of cassettes may be performed by robotics. When the automated loading process begins, the cassette is pushed forward in the direction indicated by arrow 58 over cassette load shelf 36 and onto cassette holder 40 by load plunger 66. Alignment ribs 42 assist in centering the cassette within cassette holder 40. Load plunger 66 may comprise a push arm coupled to plunger supports configured to extend up and over the top edge of load tank 28. Plunger supports may be coupled to a plunger actuator (not shown in FIG. 7) outside load tank 28.

Figure 8:
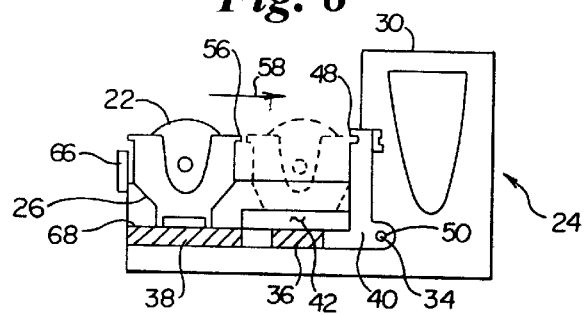
FIG. 8 is a side view, partially cut away, of one side panel, a cassette load shelf, and a cassette queuing shelf of a removable indexing rack, illustrating the pushing forward of a cassette onto a cassette holder according to an embodiment of the invention.
Figure 9:
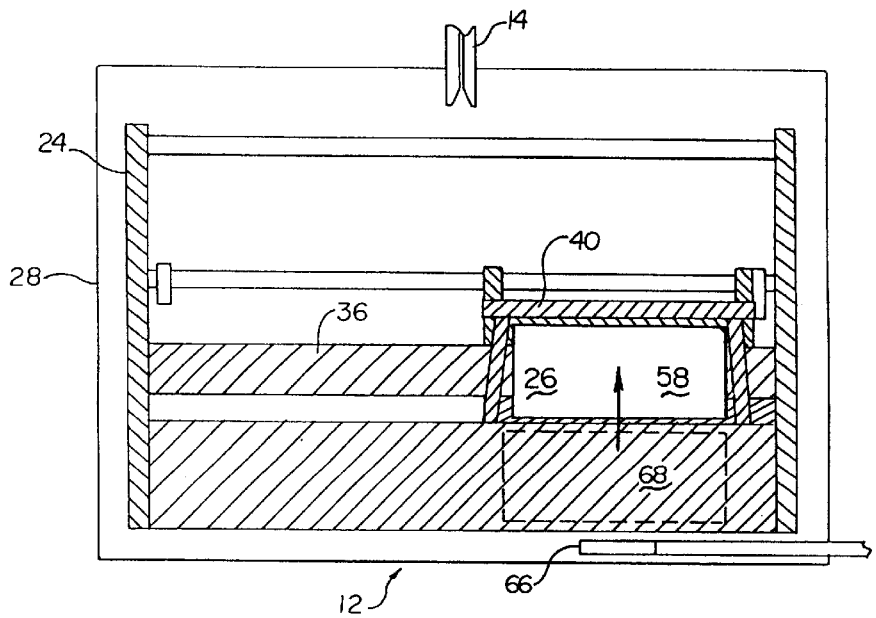
FIG. 9 is a top view of a substantially touchless hydrodynamic transport chute and a hydrodynamic load system illustrating a cassette disposed on a cassette holder according to an embodiment of the invention.

FIG. 8 is a side view, partially cut away, of one side panel 30, cassette load shelf 36, and cassette queuing shelf 38 of removable indexing rack 24, illustrating the pushing forward of cassette 26 onto cassette holder 40. Cassette holder notches 48 receive cassette tabs 56 on cassette 26. FIG. 9 is a top view illustrating cassette 26 disposed on cassette holder 40.

Figure 10:
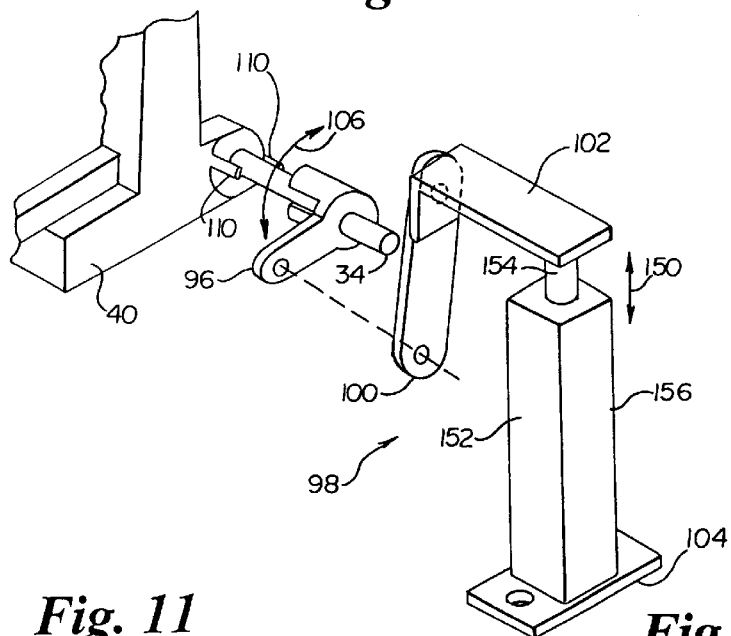
FIG. 10 is a perspective view of a rotating actuator linkage, which includes a rotating actuator arm, rotating actuator support, rotational actuator, and a rotating actuator mounting plate for fixed attachment outside the load tank according to an embodiment of the invention.

Once cassette 26 is loaded into cassette holder 40, cassette holder 40 must be rotated into a horizontal orientation. FIG. 10 illustrates rotating actuator linkage 98, which includes rotating actuator arm 100, rotating actuator support 102, rotational actuator 156, and rotating actuator mounting plate 104 for fixed attachment outside load tank 28. Rotating actuator arm 100 is pivotally coupled to lever 96 and rotating actuator support 102. When cassette holder 40 is positioned to be rotated to its horizontal orientation (see FIG. 9), lever engagement tabs 110 on cassette holder 40 engage lever 96. Movement of rotational actuator 156 in the direction indicated by arrow 150 pushes upward on rotating actuator support 102 and rotating actuator arm 100, and rotates lever 96 in the directions indicated by arrow 106. As a result, cassette holder 40 is rotated between upright and horizontal orientations. In preferred embodiments illustrated in FIG. 10, rotational actuator 156 is comprised of a cylinder 152 and piston 154. The configuration of rotating actuator arm 100 and rotating actuator support 102 enable rotational actuator 156 to remain outside load tank 28 (see FIG. 2).

Figure 11:
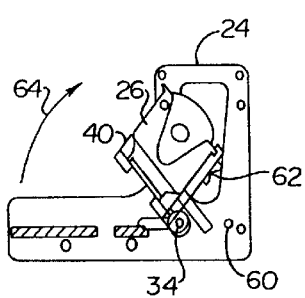
FIG. 11 is a side view of a removable indexing rack containing a cassette and a cassette holder rotating about a rotating cassette support shaft according to an embodiment of the invention.
Figure 12:
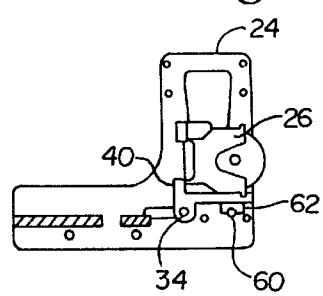
FIG. 12 is a side view of a removable indexing rack containing a cassette and a cassette holder rotated into a horizontal load orientation according to an embodiment of the invention.
Figure 13:
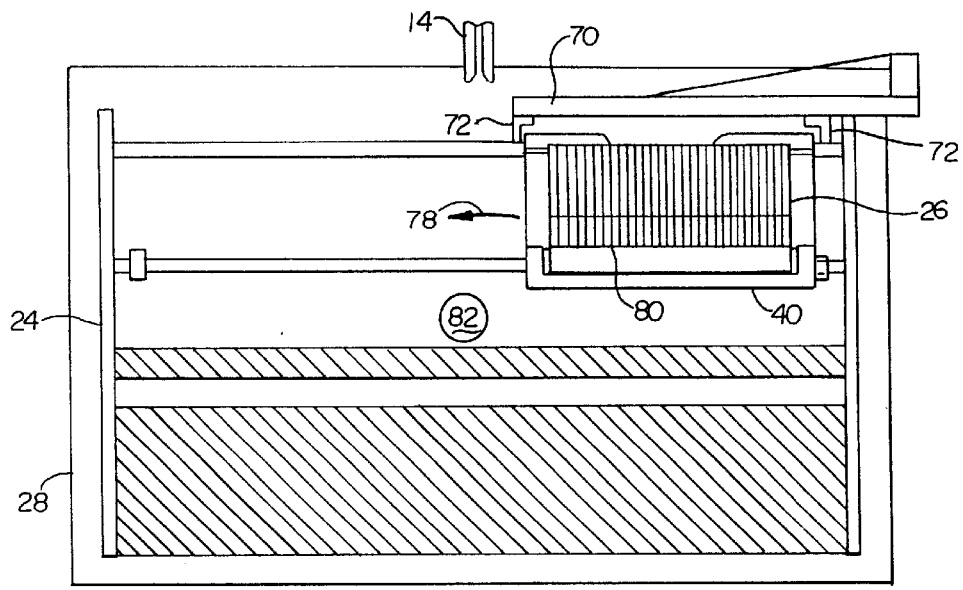
FIG. 13 is a top view of a removable indexing rack containing a cassette and a cassette holder rotated into a horizontal load orientation according to an embodiment of the invention.

FIG. 11 illustrates removable indexing rack 24 containing cassette 26 and cassette holder 40 rotating about rotating cassette support shaft 34 in the direction indicated by arrow 64. FIG. 12 illustrates cassette 26 and cassette holder 40 in the horizontal orientation, with bumpers 62 supported on fixed cassette support shaft 60. FIG. 13 illustrates cassette holder 40 and cassette 26 rotated into the horizontal orientation.

Once cassette 26 is rotated into a horizontal orientation, cassette 26 must be indexed to load disks 22 into substantially touchless hydrodynamic transport chute 14. For this purpose, an indexing actuator linkage 70 is positioned as illustrated in FIG. 13 prior to the rotation of cassette holder 40 into the horizontal orientation. Thus, when cassette holder 40 is rotated into the horizontal orientation, cassette holder 40 is positioned within indexing actuator arms 72.

Figure 14:
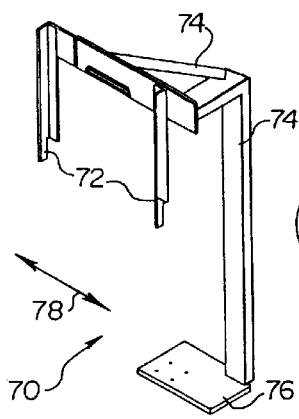
FIG. 14 is a perspective view of an indexing actuator linkage, which includes indexing actuator arms, indexing actuator supports, and indexing actuator mounting plate for fixed attachment to a linear actuator according to an embodiment of the invention.

FIG. 14 illustrates indexing actuator linkage 70, which includes indexing actuator arms 72, indexing actuator supports 74, and indexing actuator mounting plate 76 for fixed attachment to a linear actuator (not shown). In preferred embodiments of the present invention, the linear actuator is a screw drive. When movement of the linear actuator moves indexing actuator linkage 70 in the direction indicated by arrow 78 (see FIG. 14), indexing actuator arms 72 push cassette holder 40 as illustrated in FIG. 13. The configuration of indexing actuator arms 72 and indexing actuator supports 74 enable the linear actuator to remain outside load tank 28. Referring again to FIG. 13, as the linear actuator moves cassette holder 40 in the direction indicated by arrow 78, the exposed back ends 80 of disks 22 pass in front of spray post 82. In preferred embodiments of the present invention, spray post 82 is a single post extending upward from the floor of load tank 28. However, in alternative embodiments, spray post 82 may take on any number of configurations, including two separate posts.

Figure 15:
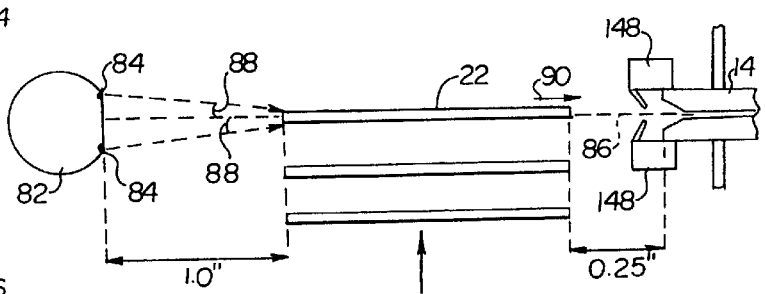
FIG. 15 is a top view of a spray post having multiple spray nozzles for pushing disks into a substantially touchless hydrodynamic transport chute according to an embodiment of the invention.

As illustrated in FIG. 15, fluid enters spray post 82 from the bottom of spray post 82 and, in preferred embodiments, exits through multiple spray nozzles 84 located on spray post 82 on both sides of a plane 86. Disks 22 to be pushed into substantially touchless hydrodynamic transport chute 14 must be located approximately on plane 86. In preferred embodiments of the present invention, spray post 82 is located about 1.0" from disk 22, disk 22 is located about 0.25" from substantially touchless hydrodynamic transport chute 14, and spray nozzles 84 are angled at a 7.5° angle from disk 22 as indicated by reference character 88. After a disk 22 is positioned along plane 86 by the linear actuator, fluid is rapidly forced out of spray nozzles 84. The resulting jet of fluid contacts the sides of disk 22 and causes disk 22 to move into substantially touchless hydrodynamic transport chute 14 the direction indicated by arrow 90. In preferred embodiments of the present invention, fluid flows from spray nozzles 84 for only about one or two seconds. After disk 22 has been loaded into substantially touchless hydrodynamic transport chute 14, the linear actuator causes cassette 26 to be repositioned such that the next disk 22 lies along plane 86, and the process is repeated until all disks 22 have been loaded.

In alternative embodiments of the present invention, a gate 148 may be employed which opens only when a disk 22 is being pushed into substantially touchless hydrodynamic transport chute 14. Until gate 148 is opened, no fluid flows in substantially touchless hydrodynamic transport chute 14. Once gate 148 is opened, the combination of fluid flow into substantially touchless hydrodynamic transport chute 14 and the jet flow from spray nozzles 84 induce disk 22 into substantially touchless hydrodynamic transport chute 14. Once disk 22 is inside substantially touchless hydrodynamic transport chute 14, gate 148 closes. Thus, gate 148 may reduce the amount of fluid needed to maintain an appropriate fluid level in load tank 28.

Figure 16:
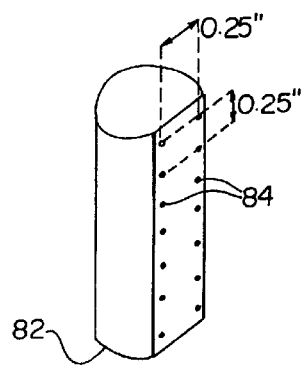
FIG. 16 is a perspective view of a spray post showing spray nozzle locations according to an embodiment of the invention.

As illustrated in FIG. 16, spray nozzles 84 may be positioned in pairs of columns, with one column in any pair of columns on each side of plane 86 (see FIG. 15) and an equal number of spray nozzles 84 in each column in any pair of columns. In preferred embodiments of the present invention, two columns of seven spray nozzles 84 each are employed, with the spray nozzles 84 in each column being separated by about 0.25", the columns being separated by about 0.25", and each spray nozzle having a diameter of about 0.020". It should be noted that the dimensions given herein with reference to FIGS. 15 and 16 are interrelated and dependent on the size and positioning of the objects to be loaded, and therefore other combinations of dimensions may also adequately propel disk 22 into substantially touchless hydrodynamic transport chute 14.

Figure 17:
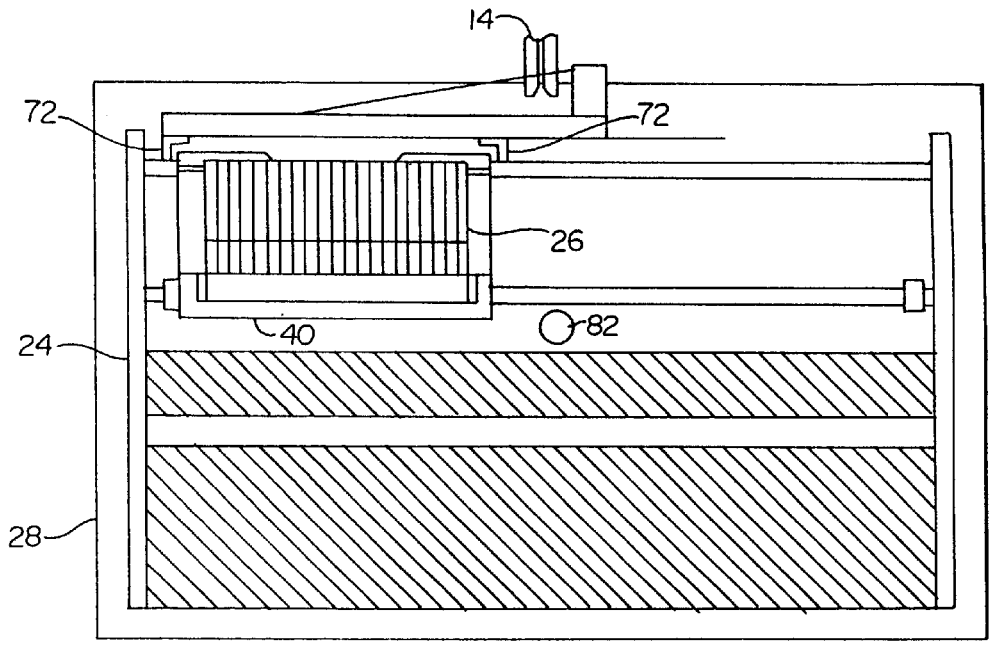
FIG. 17 is a top view of a removable indexing rack illustrating the positions of an empty cassette and a cassette holder after all disks have been loaded according to an embodiment of the invention.
Figure 18:
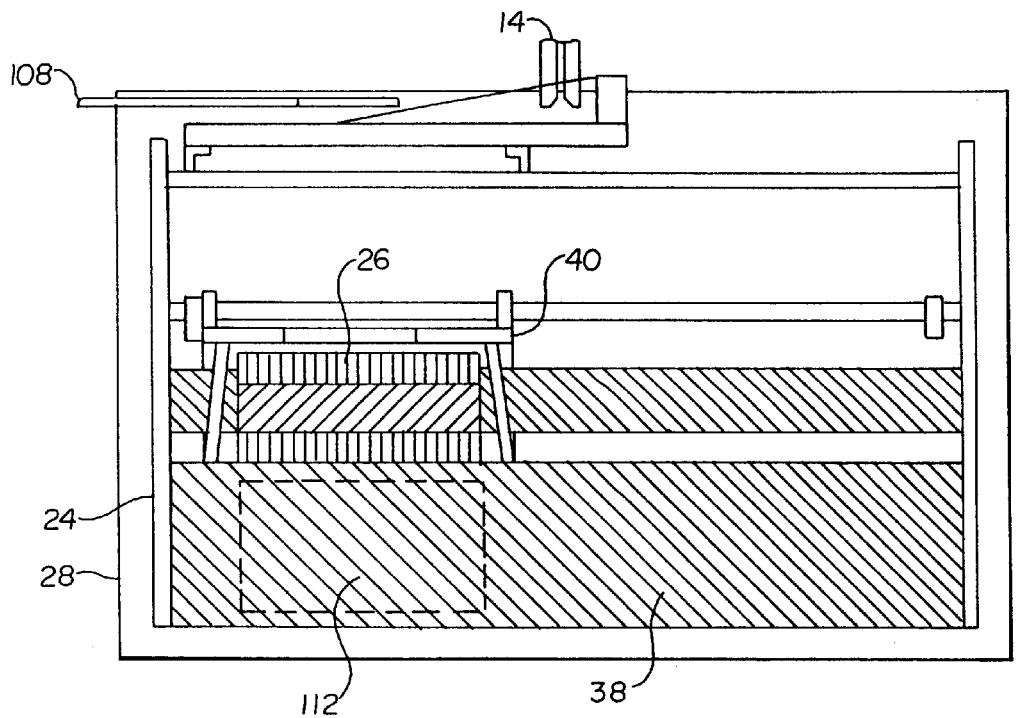
FIG. 18 is a top view of a removable indexing rack illustrating the positions of an empty cassette and a cassette holder rotated back into an upright orientation after all disks have been loaded according to an embodiment of the invention.

When all disks 22 have been loaded, empty cassette 26 and cassette holder 40 are positioned as shown in FIG. 17. Cassette holder 40 and cassette 26 are then rotated back into an upright position as shown in FIG. 18. Once cassette 26 is in an upright position, unload plunger 108 pushes cassette 26 back onto unload area 112 on cassette queuing shelf 38.

Therefore, in embodiments of the present invention described above, after a single cassette 26 is placed into a load area, cassette 26 is automatically indexed until all disks 22 have been loaded into substantially touchless hydrodynamic transport chute 14, and then cassette 26 is relocated to unload area 112. However, in alternative embodiments described below, multiple cassettes 26 can be placed onto cassette queuing shelf 38, and all cassettes 26 can be automatically indexed and relocated to queuing shelf 38.

Figure 19:
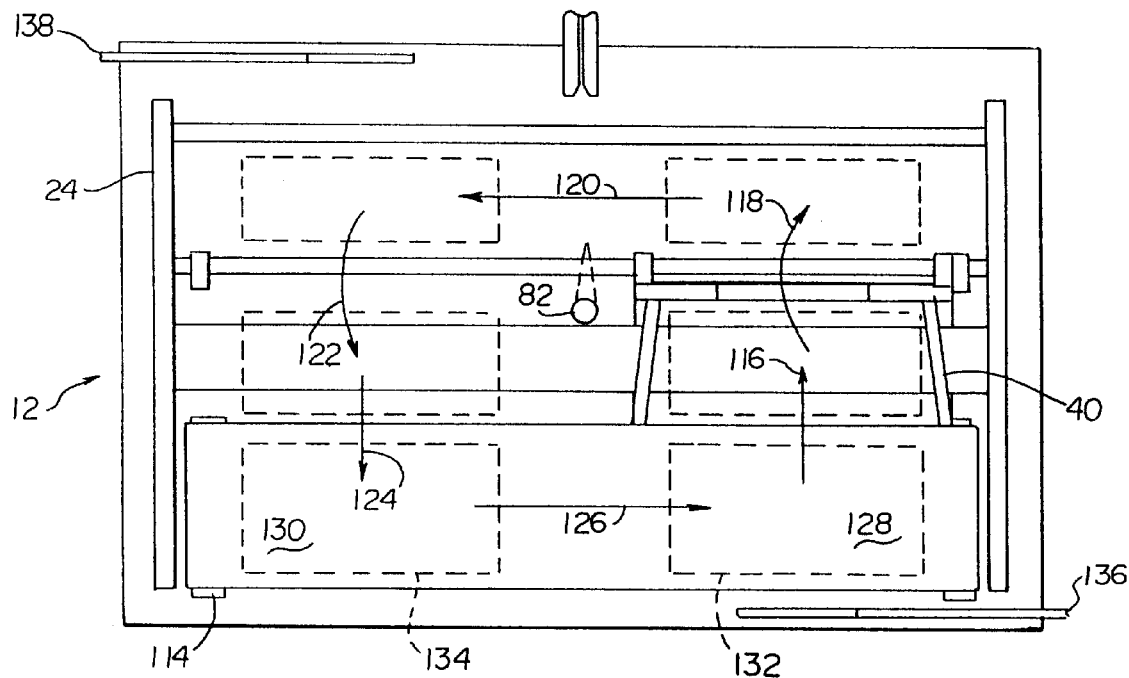
FIG. 19 is a top view of a removable indexing rack having a queuing drive belt, symbolically illustrating the movement of a cassette holder and cassette around the removable indexing rack during the indexing process according to an embodiment of the invention.

FIG. 19 illustrates a hydrodynamic load system 12 including a removable indexing rack 24 with a queuing drive belt 114 replacing a cassette queuing shelf according to an alternative embodiment of the present invention. Prior to the automated loading sequence, an operator loads first cassette 128 containing disks into first load area 132 and second cassette 130 containing disks into second load area 134. In alternative embodiments, the loading of cassettes may be performed by robotics. When the automated loading process begins, first cassette 128 is pushed forward onto cassette holder 40 by first load plunger 136 as indicated by arrow 116. Cassette holder 40 and first cassette 128 are then rotated into a load orientation by the rotating actuator linkage as indicated by arrow 118. First cassette 128 is then indexed by the indexing actuator linkage as indicated by arrow 120, with spray post 82 loading individual disks into substantially touchless hydrodynamic transport chute 14. After first cassette 128 completes the indexing process, cassette holder 40 and first cassette 128 are rotated into an upright orientation by the rotating actuator linkage as indicated by arrow 122. First cassette 128 is then pushed back onto second load area 134 by second unload plunger 138 as indicated by arrow 124. In addition, at some time after first cassette 128 is pushed forward onto cassette holder 40 but before first cassette 128 is pushed back onto second load area 134, second cassette 130 in second load area 134 is queued to first load area 132 by queuing drive belt 114 as indicated by arrow 126. This automated indexing process then repeats for second cassette 130. It should be noted that although the embodiment described above with respect to FIG. 19 describes and illustrates the indexing of only two cassettes, in other alternative embodiments hydrodynamic load system 12 may accept and index any number of cassettes.

Figure 20:
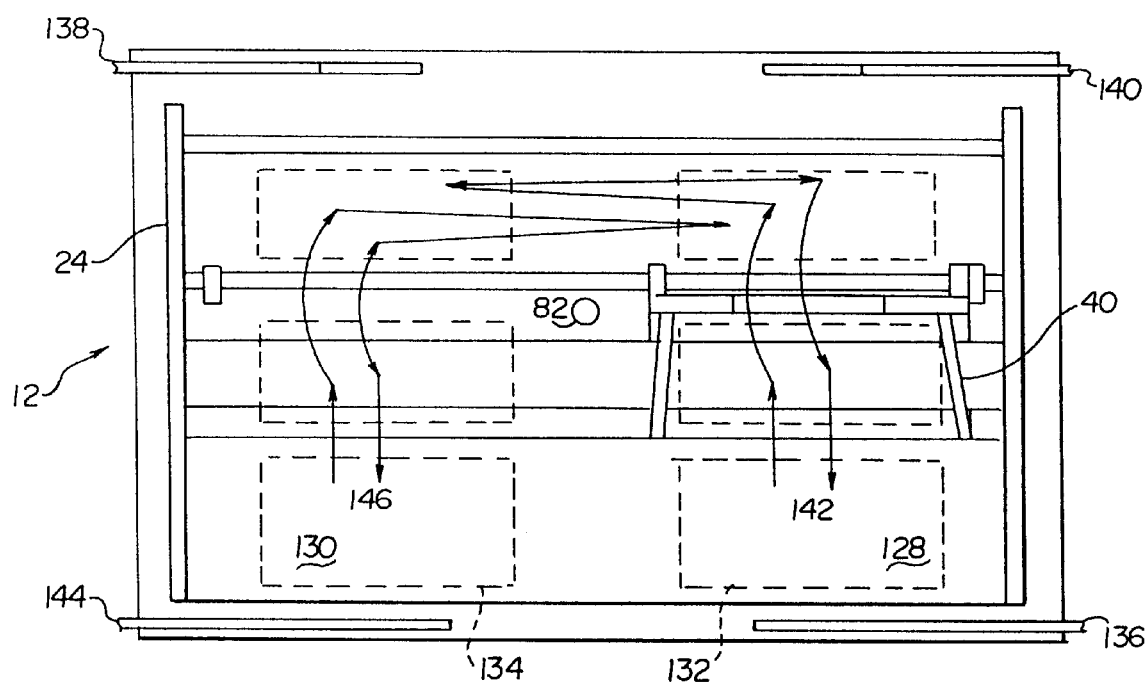
FIG. 20 is a top view of a removable indexing rack without a queuing drive belt, symbolically illustrating the movement of two cassette holders and cassettes around the removable indexing rack during the indexing process according to an embodiment of the invention.

FIG. 20 illustrates a hydrodynamic load system 12 including a removable indexing rack 24 without a queuing drive belt 114 according to another alternative embodiment of the present invention. Prior to the automated loading sequence, an operator loads first cassette 128 containing disks 22 into first load area 132 and second cassette 130 containing disks 22 into second load area 134. In alternative embodiments, the loading of cassettes may be performed by robotics. First cassette 128 is then pushed forward onto cassette holder 40 by first load plunger 136, rotated into a horizontal orientation by the rotating actuator linkage, indexed and returned to the indexing start position by the indexing actuator linkage, rotated back into an upright orientation by the rotating actuator linkage, then pushed back into first load area 132 by first unload plunger 140. This path for this sequence is indicated by arrow 142. Cassette holder 40 is then re-positioned by the indexing actuator linkage to accept second cassette 130, which is pushed forward onto cassette holder 40 by second load plunger 144, rotated into a horizontal orientation by rotating actuator linkage 98, indexed and returned to the indexing start position by the indexing actuator linkage, rotated back into an upright orientation by the rotating actuator linkage, then pushed back into second load area 134 by second unload plunger 138. This path for this sequence is indicated by arrow 146.

It should be noted that although the embodiment described above with respect to FIG. 20 describes and illustrates the indexing of only two cassettes, in other alternative embodiments hydrodynamic load system 12 may accept and index any number of cassettes. In such embodiments, multiple load and unload plungers may be employed, one pair for each load area, or one or more pairs of load and unload plungers, re-positionable using a mechanism similar to the indexing actuator linkage, may alternatively be employed. In addition, in any of the above-described embodiments employing a load and unload plunger pair, in alternative embodiments a plunger removably couplable to the cassette may be employed to both push and pull cassettes onto and off of the cassette holder.

Figure 21:
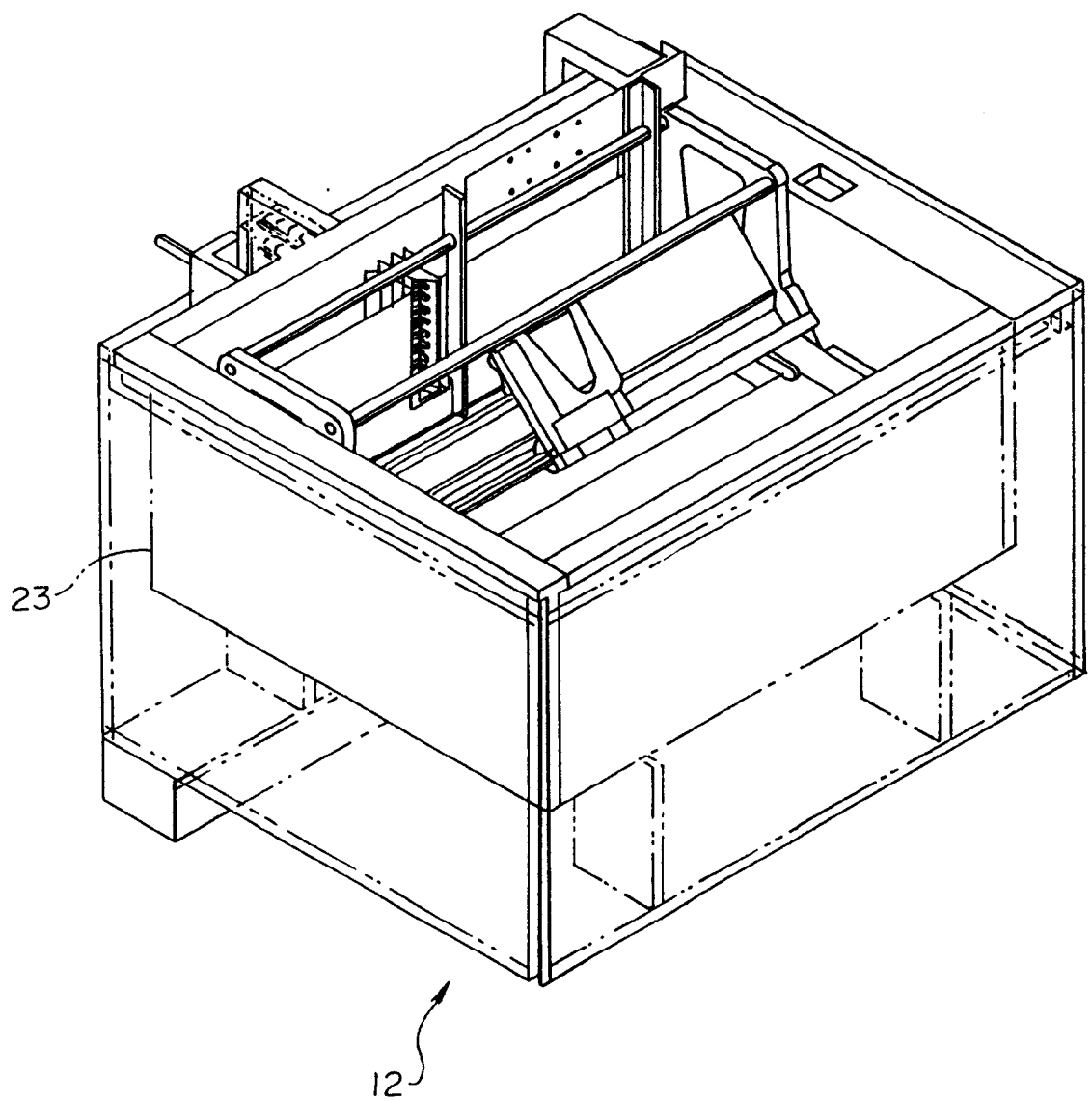
FIG. 21 is a perspective view of a hydrodynamic load system according to an embodiment of the invention.

FIG. 21 illustrates a hydrodynamic load system 12 according to a preferred embodiment of the present invention. Note that load tank 28 is removable for ease of cleaning and maintenance.

Hydrodynamic unload system 20 (see FIG. 1) is similar to hydrodynamic load system 12, and in preferred embodiments is identical. However, spray post 82 is not utilized in hydrodynamic unload system 20, for disks 22 are forced out of a substantially touchless hydrodynamic transport chute 14 and into cassette 26 by forces within substantially touchless hydrodynamic transport chute 14.

It should be noted that the hydrodynamic load and unload systems 12 and 20 described herein also allow process steps such as ultrasonic cleaning to be performed while cassettes 26 containing disks 22 are within the fluid bath of load tank 28. In addition, although the hydrodynamic load and unload systems 12 and 20 described herein describe the loading of only one disk 22 at a time into substantially touchless hydrodynamic transport chute 14, in alternative embodiments multiple disks 22 may be simultaneously loaded into multiple substantially touchless hydrodynamic transport chutes 14.

It should be noted that although the preceding discussion focused on the loading and unloading of disks 22 into and out of substantially touchless hydrodynamic transport chutes 14, embodiments of the present invention are not limited to the transport of recording disks. Objects capable of being loaded and unloaded may include, but are not limited to, magnetic recording media, semiconductor wafers, and glass, plastic, or metal articles.

Therefore, according to the foregoing description, preferred embodiments of the present invention provide a system and method for hydrodynamic loading and unloading of objects into and out of substantially touchless hydrodynamic transport systems to minimize frictional wear and damage to the object, minimize the chance of breakage of the object due to dropping or other mishandling, and minimize the introduction of contaminants. Embodiments of the invention also enable multiple objects to be loaded or unloaded into and out of substantially touchless hydrodynamic transport systems in an automated fashion to increase the speed and efficiency of the manufacturing process, and decrease costs. The speed, safety, and efficiency of the manufacturing process is also improved by utilizing cassettes containing multiple objects. Embodiments of the invention also enable process steps to be performed during the loading and unloading process.

The foregoing description of preferred embodiments of the invention has been presented for the purposes of illustration and description. It is not intended to be exhaustive or to limit the invention to the precise form disclosed. It is intended that the scope of the invention be limited not by this detailed description, but rather by the claims appended hereto.

What is claimed is:

1. A system for hydrodynamically loading objects into a manufacturing system, comrising:

a receptacle for retaining fluid, the receptacle having an aperture for egress to a manufacturing system;

at least one cassette supported within the receptacle for retaining a plurality of objects and positioning one of the objects in a loading location in alignment with the aperture; and at least one nozzle disposed within the receptacle for ejecting fluid and urging objects in the loading location into the aperture, the at least one nozzle comprising at least one pair of nozzles, each nozzle in the at least one pair of nozzles being normal to and on opposite sides of a plane passing through the loading location and the aperture and equidistant to the plane and any object in the loading location.

2. A system as recited in claim 1, the nozzles on each side of the plane being linearly aligned and equally spaced from one another.

3. A system as recited in claim 2, wherein both nozzles in each at least one pair of nozzles are directed towards the loading location at a substantially identical angle with respect to the plane.

4. A system as recited in claim 3, further including a cassette holder for retaining and indexing the at least one cassette such that each object in the at least one cassette becomes momentarily positioned in the loading location.

5. A system as recited in claim 1, further including a controllable gate for blocking substantially all access to the aperture until approximately the time when the at least one pair of nozzles eject fluid for urging an object in the loading location into the aperture.

6. A system as recited in claim 4, further including a removable indexing rack supported within the receptacle for rotatably and slidably retaining the cassette holder and for supporting at least one cassette within the receptacle.

7. A system as recited in claim 6, wherein the removable indexing rack further includes a first load area for loading a first cassette to be automatically indexed.

8. A system as recited in claim 7, further including:

a first load plunger for re-positioning a cassette in the first load area onto the cassette holder in an upright orientation;

a rotational actuator for rotating the cassette holder to a horizontal orientation; and a linear actuator for indexing the cassette holder and cassette.

9. A system as recited in claim 8, wherein the removable indexing rack further includes at least one secondary load area for loading at least one secondary cassette to be indexed.

10. A system as recited in claim 9, wherein the removable indexing rack further includes a queuing drive belt for relocating any cassettes in the at least one secondary load area to the first load area.

* * * * *

UNITED STATES PATENT AND TRADEMARK OFFICE
CERTIFICATE OF CORRECTION

PATENT NO. : 6,264,404 B1
DATED : July 24, 2001
INVENTOR(S) : Hessburg et al.

Page 1 of 1

It is certified that error appears in the above-identified patent and that said Letters Patent is hereby corrected as shown below:

<u>Column 1,</u>
Line 20, "Modem" should read -- Modern --
Line 64, "an" should read -- a --

<u>Column 4,</u>
Line 42, "Modem" should read -- Modern --

<u>Colunm 7,</u>
Line 50, "induce" should read -- induces --

<u>Column 10,</u>
Line 10, "comrising" should read -- comprising --

Signed and Sealed this

Thirtieth Day of April, 2002

Attest:

Attesting Officer

JAMES E. ROGAN
*Director of the United States Patent and Trademark Office*